United States Patent
Kim et al.

(10) Patent No.: US 9,881,822 B2
(45) Date of Patent: Jan. 30, 2018

(54) MULTI-STEPPED BOAT ASSEMBLY FOR RECEIVING SEMICONDUCTOR PACKAGES

(71) Applicants: Sunrak Kim, Daejeon (KR); Hohyeuk Im, Seoul (KR)

(72) Inventors: Sunrak Kim, Daejeon (KR); Hohyeuk Im, Seoul (KR)

(73) Assignee: Samsung Electronics Co., Ltd. (KR)

(*) Notice: Subject to any disclaimer, the term of this patent is extended or adjusted under 35 U.S.C. 154(b) by 108 days.

(21) Appl. No.: 14/856,048

(22) Filed: Sep. 16, 2015

(65) Prior Publication Data
US 2016/0086834 A1    Mar. 24, 2016

(30) Foreign Application Priority Data
Sep. 19, 2014   (KR) .................. 10-2014-0125094

(51) Int. Cl.
H01L 21/673   (2006.01)

(52) U.S. Cl.
CPC ............... H01L 21/67333 (2013.01)

(58) Field of Classification Search
CPC ..... H01L 21/67333; H01L 2221/68313; H01L 21/67369; H01L 21/6835; H05K 13/0084; H05K 7/1084
USPC ......................................... 206/713–718, 832
See application file for complete search history.

(56) References Cited

U.S. PATENT DOCUMENTS

| | | | | |
|---|---|---|---|---|
| 4,393,808 A * | 7/1983 | Braden | ............... | H05K 13/028 118/503 |
| 5,103,976 A * | 4/1992 | Murphy | ............ | H01L 21/67333 206/509 |
| 5,606,793 A | 3/1997 | Gross et al. | | |
| 5,746,319 A * | 5/1998 | Murphy | ............ | H01L 21/67333 206/511 |
| 6,332,946 B1 * | 12/2001 | Emmett | ............ | H01L 21/67356 156/299 |
| 7,407,359 B2 * | 8/2008 | Sisson | ............... | H01L 21/67333 414/404 |
| 8,603,860 B2 | 12/2013 | Chen et al. | | |
| 8,889,486 B2 | 11/2014 | Chen et al. | | |
| 2003/0231469 A1 * | 12/2003 | Ono | .................. | H01L 21/67333 361/715 |
| 2007/0215517 A1 * | 9/2007 | Holler | ............... | H01L 21/67333 206/725 |

(Continued)

FOREIGN PATENT DOCUMENTS

KR    1019920018279    10/1992
KR    10-1994-0010246 A    5/1994

(Continued)

*Primary Examiner* — Chun Cheung
(74) *Attorney, Agent, or Firm* — Myers Bigel, P.A.

(57) ABSTRACT

A multi-stepped boat assembly includes a stack boat having at least one stack hole configured to receive a first semiconductor package and a second semiconductor package vertically stacked on the first semiconductor package in the stack hole. A guide boat has at least one guide hole vertically aligned with the at least one stack hole. The guide boat is removably attachable to the stack boat. An inner sidewall of the stack hole includes a first step configured to receive the first semiconductor package, and a second step provided on the first step and configured to receive the second semiconductor package. The guide hole extends toward the stack hole to guide movement of the first semiconductor package to the first step.

20 Claims, 13 Drawing Sheets

(56) References Cited

U.S. PATENT DOCUMENTS

2011/0042265 A1*  2/2011  Hofmann ............. G01R 1/0425
                                                    206/701
2012/0280404 A1   11/2012  Kwon et al.

FOREIGN PATENT DOCUMENTS

| KR | 20010053793 A | 7/2001 |
| KR | 1020020053793 | 7/2001 |
| KR | 10-0390452 B1 | 7/2003 |
| KR | 1020030058843 | 7/2003 |
| KR | 1020100066821 | 6/2010 |
| KR | 1020120123928 | 11/2012 |

* cited by examiner

MULTI-STEPPED BOAT ASSEMBLY FOR RECEIVING SEMICONDUCTOR PACKAGES

CROSS-REFERENCE TO RELATED APPLICATION

This application claims priority under 35 U.S.C. §119 from Korean Patent Application No. 10-2014-0125094, filed on Sep. 19, 2014, the disclosure of which is hereby incorporated by reference in its entirety.

BACKGROUND

The inventive concepts relate to a semiconductor apparatus. More particularly, the inventive concepts relate to a multi-stepped boat assembly for receiving semiconductor packages of which sizes are different from each other.

A package-on-package (PoP) device has been developed to realize small-sized and various performance semiconductor products. The PoP device includes semiconductor packages which are sequentially stacked. A boat capable of receiving semiconductor packages may be generally used to stack the semiconductor packages. There is a need, however, for a boat having an improved structure to stably stack semiconductor packages with sizes that are different from each other.

SUMMARY

Embodiments of the inventive concepts may provide a multi-stepped boat capable of receiving semiconductor packages of which sizes are different from each other.

Embodiments of the inventive concepts may also provide a multi-stepped boat assembly capable of stably receiving semiconductor packages having different sizes without damage.

In some embodiments, a multi-stepped boat assembly may include: a stack boat having at least one stack hole configured to receive a first semiconductor package and a second semiconductor package that is configured to be vertically stacked on the first semiconductor package in the stack hole; and a guide boat having at least one guide hole vertically aligned with the at least one stack hole, the guide boat being removably attachable to the stack boat. An inner sidewall of the stack hole may include: a first step configured to receive the first semiconductor package; and a second step provided on the first step and configured to receive the second semiconductor package. The guide hole may extend toward the stack hole to guide movement of the first semiconductor package to the first step.

In some embodiments, the first step may include: a first support surface configured to support the first semiconductor package; and a first inner sidewall extending from the first support surface toward the second step. The second step may include: a second support surface configured to support the second semiconductor package; and a second inner surface extending from the second support surface. The first support surface and the second support surface may be horizontal.

In some embodiments, the first inner sidewall and the second inner sidewall may extend vertically.

In some embodiments, the first inner sidewall may further include a top end portion inclined upward such that a width of the stack hole increases as a distance from the first support surface increases.

In some embodiments, the first inner sidewall may be inclined upward such that a width of the stack hole increases as a distance from the first support surface increases. The second inner sidewall may be vertical.

In some embodiments, the inner sidewall of the stack hole may further include: an upper inner sidewall extending from the second step. The upper inner sidewall may be inclined upward such that a width of the stack hole increases as a distance from the second step increases.

In some embodiments, the first step may include: a first support surface supporting the first semiconductor package; and a first inner sidewall extending from the first support surface toward the second step. The first support surface may be horizontal and the first sidewall may be inclined. The second step may include: a second inner sidewall vertically extending from the first inner sidewall.

In some embodiments, the guide boat may include: a vertical portion of the guide hole configured to be inserted into the stack hole; and a horizontal portion connected to the vertical portion and configured to be supported by a top end of the stack boat.

In some embodiments, the guide hole may include a vertical lower inner sidewall and an inclined upper inner sidewall. The upper inner sidewall of the guide hole may be inclined upward such that a width of the guide hole increases as a distance from the vertical lower inner sidewall increases.

In some embodiments, a multi-stepped boat assembly may include: a stack boat having a plurality of stack holes, each of the stack holes configured to receive a first semiconductor package and a second semiconductor package vertically stacked on the first semiconductor package in the stack hole; and a guide boat having a plurality of guide holes vertically aligned with the plurality of stack holes, the guide boat being removably attachable to the stack boat. Each of the stack holes may have an inner sidewall having a multi-step configuration, and each of the guide holes may have a vertical lower inner sidewall and an inclined upper inner sidewall.

In some embodiments, the multi-step configuration may include: a first step including a first support surface supporting the first semiconductor package and a first inner sidewall vertically extending from the first support surface; and a second step provided on the first step and including a second support surface supporting the second semiconductor package and a second inner sidewall vertically extending from the second support surface. The first support surface and the second support surface may be horizontal.

In some embodiments, the first inner sidewall may further include: an inclined top end portion extending in a direction away from the first support surface so as to be connected to the second support surface.

In some embodiments, the multi-step configuration may include: a first step comprising: a first support surface supporting the first semiconductor package and a first inner sidewall extending from the first support surface; and a second step provided on the first step and including a second support surface supporting the second semiconductor package and a second inner sidewall vertically extending from the second support surface. The first support surface and the second support surface may be horizontal, and the first inner sidewall may be inclined.

In some embodiments, the multi-step configuration may include: a first step including a first support surface supporting the first semiconductor package and a first inner sidewall extending from the first support surface; and a second step provided on the first step and including a second inner sidewall vertically extending from the first inner sidewall. The first support surface may be horizontal, and the first inner sidewall may be inclined.

In some embodiments, the inner sidewall of the stack hole may further include an inclined surface extending in a direction far away from a stepped surface of the multi-step such that a width of the stack hole increases as a distance from the multi-step increases.

In some embodiments, the guide boat may include: a vertical portion forming an outer wall of the guide hole and configured to be inserted into the stack hole; and a horizontal portion connected to the vertical portion and configured to be supported by a top end of the stack boat. The vertical portion may be supported by a stepped surface of the multi-step configuration. In some embodiments, a multi-stepped boat may include: a stack boat having a plurality of stack holes, each of the stack holes configured to receive a first semiconductor package and a second semiconductor package, and the second semiconductor package vertically stacked on the first semiconductor package in the stack hole; and a guide boat having a plurality of guide holes vertically aligned with the plurality of stack holes, the guide boat being removably attachable to the stack boat. Each of the stack holes may include: an inner sidewall including first inner sidewalls facing each other and second inner sidewalls facing each other. The first inner sidewalls and the second inner sidewalls may comprise a step structure. A first distance between the first inner sidewalls may be smaller than a second distance between the second inner sidewalls. The guide boat may include: a vertical portion configured to be inserted into the stack hole and defining the guide hole having a non-uniform width; and a horizontal portion extending from the vertical portion.

In some embodiments, the first semiconductor package may be received between the first inner sidewalls which are spaced apart from each other by the first distance, and the second semiconductor package may be received between the second inner sidewalls which are spaced apart from each other by the second distance.

In some embodiments, each of the stack holes may further include: first support surfaces facing each other and supporting the first semiconductor package; and second support surfaces facing each other and supporting the second semiconductor package.

In some embodiments, each of the stack holes may further include: inclined upper inner sidewalls facing each other and extending from the second inner sidewalls. A third distance between the inclined upper inner sidewalls may increase as a distance from the second inner sidewalls increases.

In some embodiments, each of the guide holes may include: lower inner sidewalls spaced apart from each other by the first distance; and inclined upper inner sidewalls facing each other and extending from the lower inner sidewalls.

In some embodiments, a distance between the inclined upper inner sidewalls of each of the guide holes may increase as a distance from the lower inner sidewalls increases.

In some embodiments, the first inner sidewall of the stack hole may be coplanar with the lower inner sidewall of the guide hole.

In some embodiments, a multi-stepped boat assembly for receiving a semiconductor package may include: a stack boat having a plurality of stack holes configured to receive a first and a second semiconductor package that is vertically stacked on the first semiconductor package in the stack hole; and a guide boat having a plurality of guide holes configured to be vertically aligned with the plurality of stack holes of the stack boat when the guide boat is connected to the stack boat. An inner sidewall of the stack hole may include a first portion defining a first hole width that is configured to receive the first semiconductor package and a second portion defining a second hole width that is different from the first hole width and is configured to receive the second semiconductor package on the first semiconductor package.

In some embodiments, the guide holes of the guide boat may include vertical portions that are configured to extend into the second portion of the stack holes of the stack boat when the guide boat is attached to the stack boat.

In some embodiments, the vertical portions of the guide holes may be configured to guide the first semiconductor package to the first portion of the stack hole. In some embodiments, when the guide boat is removed from the stack boat, the stack hole may be configured to guide the second semiconductor package to the second portion of the stack hole such that the second semiconductor package rests on the first semiconductor package.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
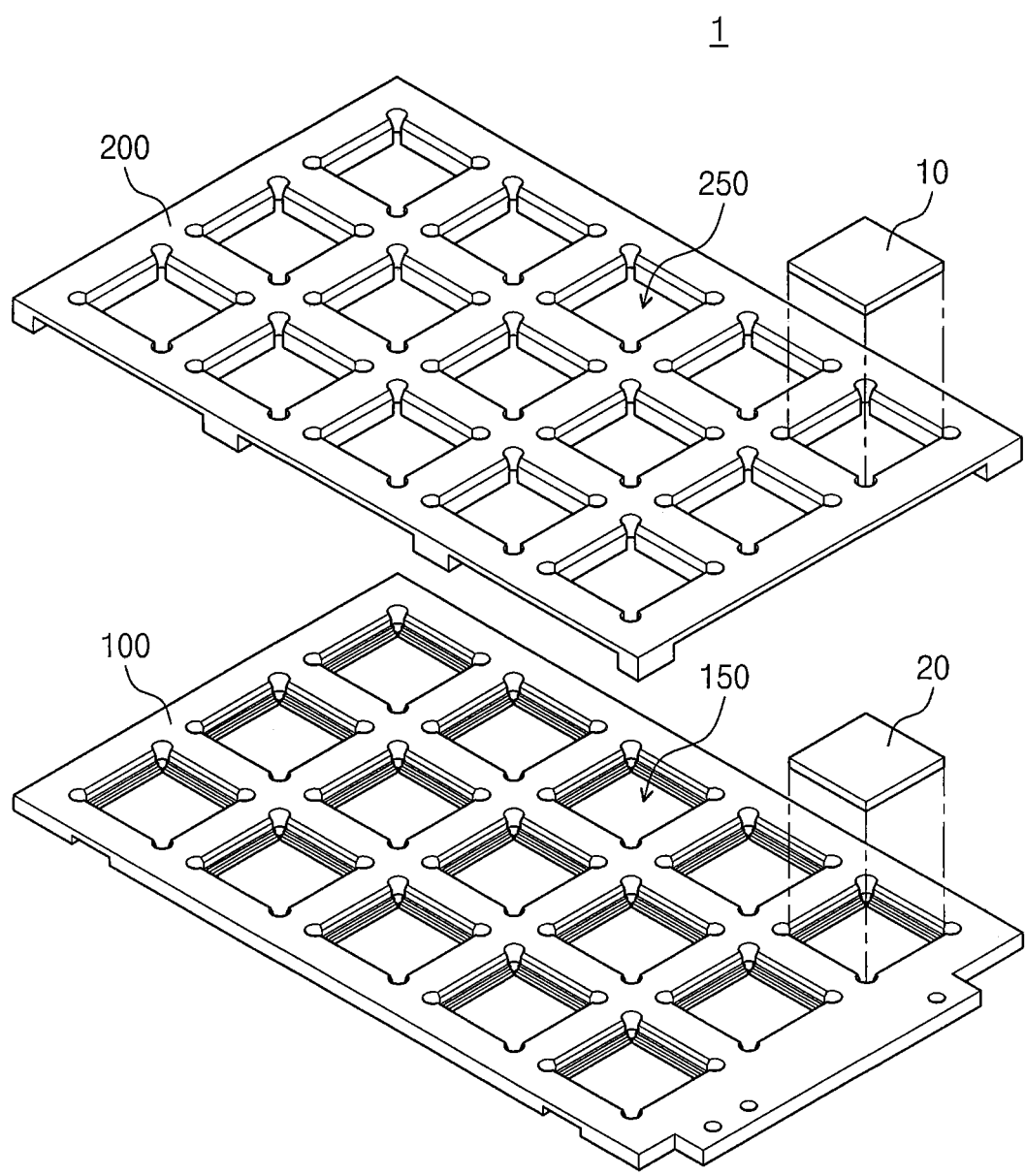
FIG. 1A is a perspective view illustrating a assembly boat for receiving semiconductor packages according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
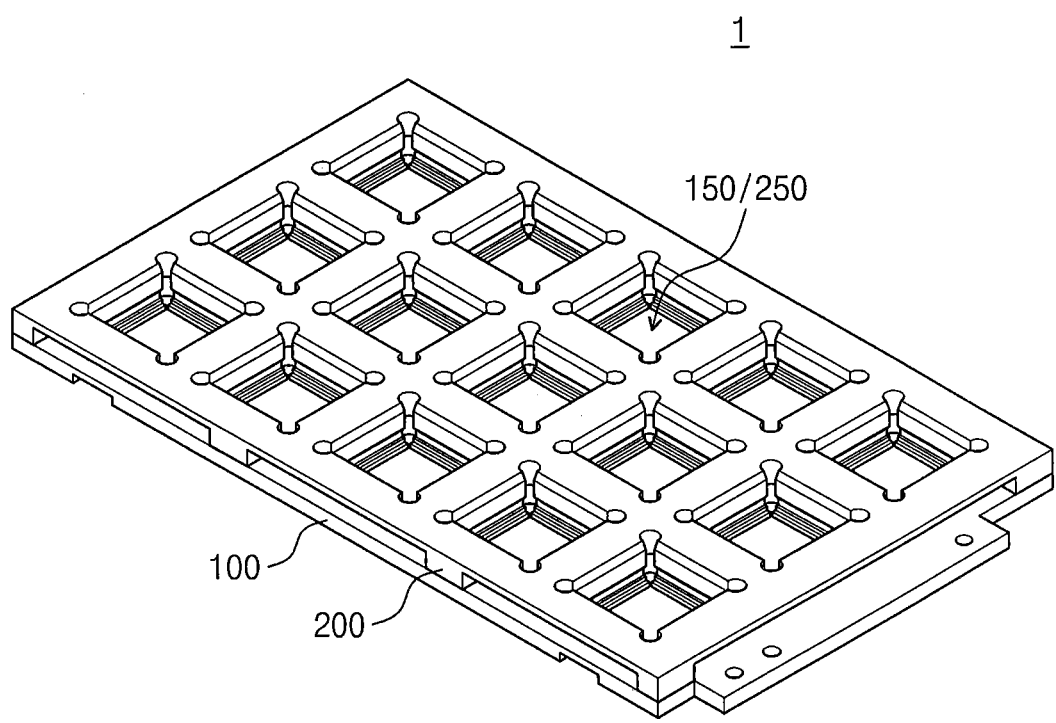
FIG. 1B is a perspective view illustrating a stack boat and a guide boat, combined with each other, of a boat assembly according to some embodiments of the inventive concepts.
Figure 1C:
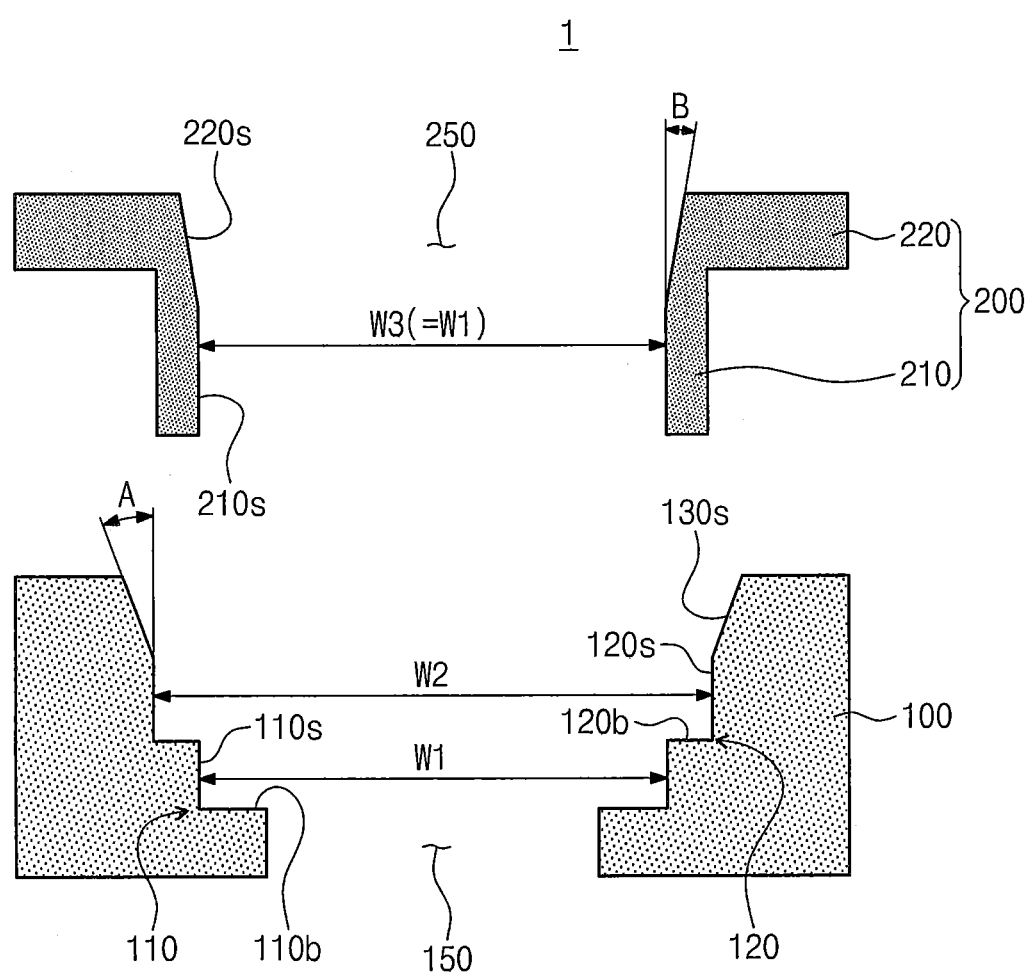
FIG. 1C is an enlarged cross-sectional view illustrating a portion of FIG. 1A.

FIG. 1A is a perspective view illustrating a boat assembly having a stack boat and a guide boat for receiving semiconductor packages according to some embodiments of the inventive concepts. FIG. 1B is a perspective view illustrating a stack boat and a guide boat, combined with each other, of a boat assembly according to some embodiments of the inventive concepts. FIG. 1C is an enlarged cross-sectional view illustrating a portion of FIG. 1A.

Referring to FIGS. 1A and 1B, a boat assembly 1 may be a semiconductor fabrication apparatus that vertically aligns at least two semiconductor packages 10 and 20 with each other to stack the semiconductor packages 10 and 20. In some embodiments, the semiconductor packages 10 and 20 may be ball grid array (BGA) type semiconductor packages having sizes that are different from each other. For example, the size of the first semiconductor package 10 may be smaller than that of the second semiconductor package 20.

The boat assembly 1 may include a stack boat 100 and a guide boat 200. The stack boat 100 may receive and vertically stack the semiconductor packages 10 and 20 having the different sizes from each other, and the guide boat 200 may guide the first semiconductor package 10 having the smaller size to the stack boat 100. The second semiconductor package 20 having the large size may be received in the stack boat 100 so as to be stacked on the first semiconductor package 10 when the guide boat 200 is separated from the stack boat 100. Each of the stack boat 100 and the guide boat 200 may be formed of any suitable material, including aluminum, steel, or steel use stainless (SUS).

Figure 2A:
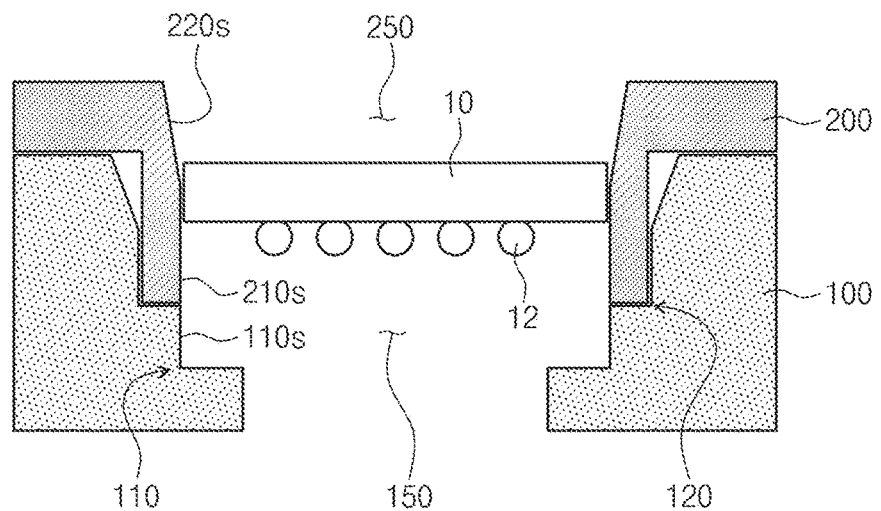
FIGS. 2A to 2D are cross-sectional views illustrating operations for receiving semiconductor packages with the boat assembly of FIG. 1A.
Figure 2B:
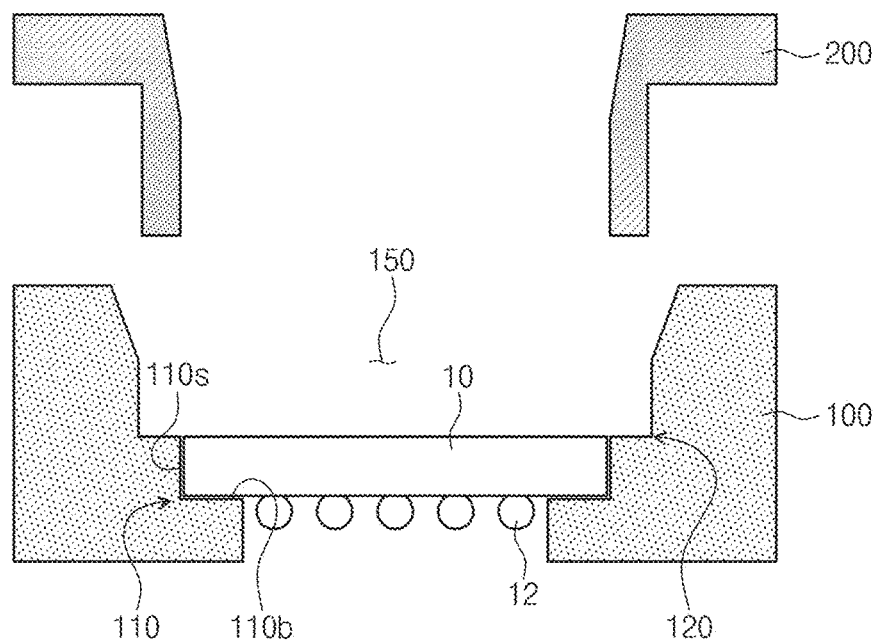
Figure 2C:
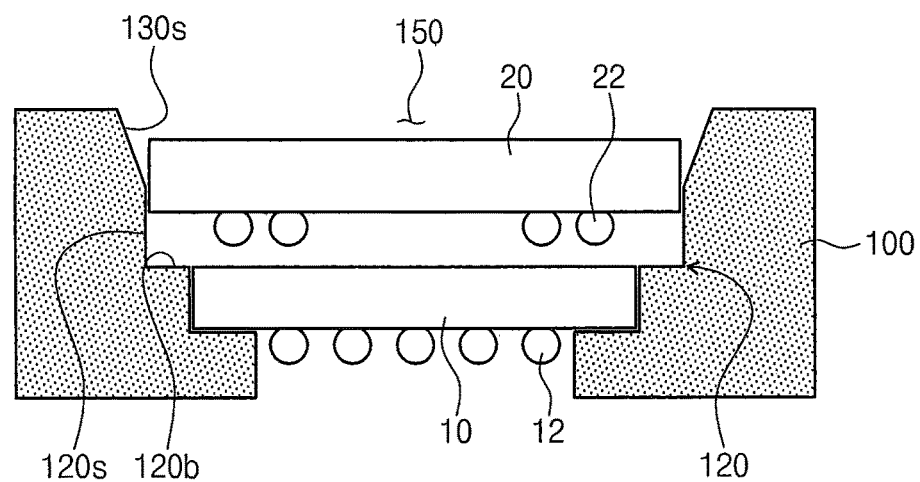
Figure 2D:
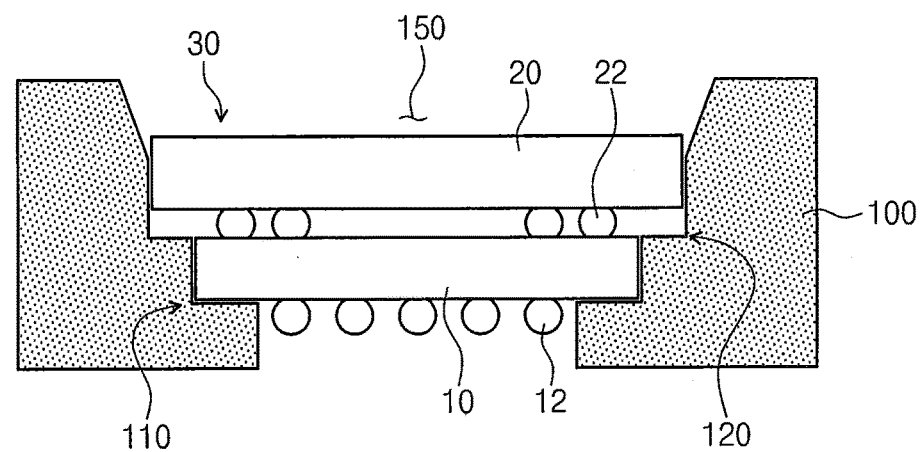
Figure 2E:
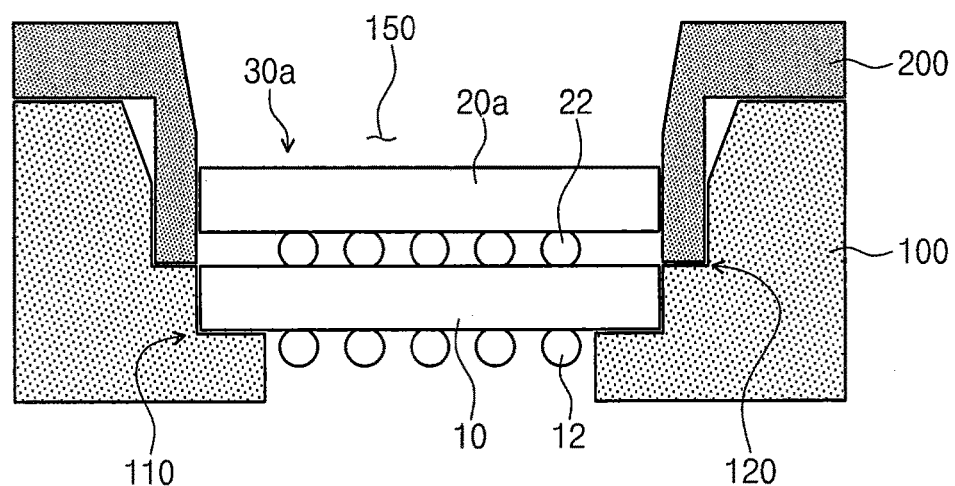
FIG. 2E is a cross-sectional view illustrating another embodiment of FIG. 2D.

In some embodiments, as illustrated in FIG. 2E, the boat 1 may be used to receive and stack first and second semiconductor packages 10 and 20a of which sizes are equal or similar to each other. For example, the second semiconductor package 20a may be received in the stack boat 100 when the guide boat 200 is combined with or attached to the stack boat 100.

Referring to FIGS. 1A and 1C, the stack boat 100 may include a plurality of stack holes 150 arranged in an array form. As illustrated in FIG. 2D, one stack hole 150 may receive the first and second semiconductor packages 10 and 20 so the first and second semiconductor packages 10 and 20 may be vertically stacked in a single stack hole 150. The stack hole 150 may have a step configuration including a first step 110 and a second step 120. The first semiconductor package 10 may be received on the first step 110, and the second semiconductor package 20 may be received on the second step 120.

In some embodiments, the first step 110 may include a first support surface 110b supporting the first semiconductor package 10 and a first inner sidewall 110s vertically extending from the first support surface 110b. The first support surface 110b may be horizontal, and the first inner sidewall 110s may be vertical. The first inner sidewall 110s, which is vertical, may suppress unnecessary shake or movement of the first semiconductor package 10 received on the first step 110.

A first width W1 between the first inner sidewalls 110s facing each other may be equal to or greater than a width of the first semiconductor package 10. If the first semiconductor package 10 is the BGA type as illustrated in FIG. 2D, an edge of the first semiconductor package 10 may be supported by the first support surface 110b. In addition, first solder balls 12 of the first semiconductor package 10 may be disposed between the first support surfaces 110b.

Likewise, the second step 120 may include a second support surface 120b supporting the second semiconductor package 20 and a second inner sidewall 120s vertically extending from the second support surface 120b. The second support surface 120b may be horizontal, and the second inner sidewall 120s may be vertical. The second inner sidewall 120s, which is vertical, may suppress unnecessary shake or movement of the second semiconductor package 20 received on the second step 120.

A second width W2 between the second inner sidewalls 120s facing each other may be equal to or greater than a width of the second semiconductor package 20. If the second semiconductor package 20 is the BGA type as illustrated in FIG. 2D, an edge of the second semiconductor package 20 may be supported by the second support surface 120b. In addition, second solder balls 22 of the second semiconductor package 20 may be received between the second support surfaces 120b.

An upper inner sidewall 130s of the stack hole 150 may be inclined. When the second semiconductor package 20 is guided into the stack hole 150 so as to be received on the second step 120 as illustrated in FIG. 2C, the second semiconductor package 20 may slide on the upper inner sidewall 130s to reach the second step 120 safely. In other words, the second semiconductor package 20 may be smoothly received by the inclined upper inner sidewalls 130s.

The upper inner sidewall 130s may have an upward slope such that a width of the stack hole 150 increases as a distance from the second step 120 increases. In other words, the width of the stack hole 150 may become progressively greater from a bottom end of the upper inner sidewall 130s to a top end of the upper inner sidewall 130s. In some embodiments, the upper inner sidewall 130s may have an angle A with respect to the second inner surface 120s. The angle A of the upper inner sidewall 130s may be greater than 0 degree and equal to or less than about 30 degrees. In other embodiments, the upper inner sidewall 130s may be vertical and coplanar with the second inner sidewall 120s.

The guide boat 200 may include a plurality of guide holes 250 arranged in an array form. Positions of the guide holes 250 may correspond to those of the stack holes 150, respectively. Thus, if the guide boat 200 is combined with the stack boat 100, the guide holes 250 may be vertically aligned with the stack holes 150, respectively.

The guide boat 200 may include a vertical portion 210 inserted into the stack hole 150 so as to be supported by the second support surface 120b and a horizontal portion 220 supported by a top surface of the stack boat 100. The guide hole 250 may be surrounded and defined by the vertical portion 210. The guide hole 250 may have a lower inner sidewall 210s and an upper inner sidewall 220s. The lower inner sidewalls 210s may have a third width W3 that is equal or similar to the first width W1.

The upper inner sidewall 220s of the guide hole 250 may be inclined. When the first semiconductor package 10 is guided by the guide boat 200 so as to be received on the first step 110 as illustrated in FIG. 2A, the first semiconductor package 10 may slide on the upper inner sidewalls 220s so as to reach the first step 110 safely. In other words, the first semiconductor package 10 may be smoothly received by the upper inner sidewall 220s of the guide hole 250.

The lower inner sidewall 210s of the guide hole 250 may be vertical. The vertical lower inner sidewall 210s may maintain horizontality the first semiconductor package 10 in the guide hole 250. Since the first semiconductor chip 10 descends along the lower inner sidewall 210s while maintaining its horizontal orientation, the first semiconductor chip 10 may be easily and safely received on the first step 110 as shown in FIGS. 2A-2B.

The upper inner sidewall 220s of the guide hole 250 may have an upward slope such that a width of the guide hole 250 increases as a distance from the lower inner sidewall 210s increases. In some embodiments, the upper inner sidewall 220s of the guide hole 250 may have an angle B that is greater than 0 degree and equal to or less than about 30 degrees. In some embodiments, however, the upper inner sidewall 220s of the guide hole 250 may be vertical and coplanar with the lower inner sidewall 210s.

FIGS. 2A to 2D are cross-sectional views illustrating operations for receiving semiconductor packages by the boat assembly of FIG. 1A. FIG. 2E is a cross-sectional view illustrating another embodiment of a boat assembly.

Referring to FIG. 2A, the stack boat 100 may be combined with or releasably connected to the guide boat 200. Thus, the lower inner sidewall 210s of the guide hole 250 may be coplanar with the first inner sidewall 110s of the stack hole 150 to provide a vertical descent path of the first semiconductor package 10. The first semiconductor package 10 may be the BGA type semiconductor package including a plurality of first solder balls 12. In other words, the first solder balls 12 may be arranged in an array formed on one surface of the first semiconductor package 10. When the guide boat 200 is attached to the stack boat 100, the first semiconductor package 10 may descend according to the guidance of the guide boat 200 so as to be received on the first step 110 of the stack boat 100.

When the first semiconductor package 10 is provided to the guide hole 250, the first semiconductor package 10 may not be vertically aligned with the guide hole 250 or may be non-horizontal. In this case, the first semiconductor package 10 may slide on the inclined upper inner sidewalls 220s of the guide hole 250 so as to be self-aligned, so that the first semiconductor package 10 may be stably positioned adjacent the lower inner sidewall 210s of the guide hole 250. Thereafter, the first semiconductor package 10 may descend along the lower inner sidewall 210s while maintaining its horizontality. Thus, the first semiconductor package 10 may be received safely on the first step 110.

Referring to FIG. 2B, if the first semiconductor package 10 is received on the first step 110 of the stack boat 100, the guide boat 200 may be taken away or released from the stack boat 100. Thus, the second step 120 of the stack hole 150 may be exposed.

Referring to FIG. 2C, the second semiconductor package 20 may be provided into the stack hole 250 so as to be received on the second step 120. The second semiconductor package 20 may be the BGA type semiconductor package. In other words, the second semiconductor package 20 may include a plurality of second solder balls 22. The second semiconductor package 20 may descend along the second inner sidewall 120s so as to be received on the second step 120.

When the second semiconductor package 20 is provided to the stack hole 150, the second semiconductor package 20 may not be vertically aligned with the stack hole 150 or may be non-horizontal. In this case, the second semiconductor package 20 may slide on the inclined upper inner sidewalls 130s of the stack hole 150 so as to be self-aligned, so that the second semiconductor package 20 may be stably provided to the second inner sidewall 120s of the stack hole 150. Thereafter, the second semiconductor package 20 may descend along the second inner sidewall 120s while maintaining its horizontality. Thus, the second semiconductor package 20 may be received safely on the second step 120.

Referring to FIG. 2D, a package-on-package (PoP) device 30 including the large-sized second semiconductor package 20 stacked on the small-sized first semiconductor package 10 may be fabricated by the reception of the first semiconductor chip 10 to the first step 10 and the reception of the second semiconductor chip 20 to the second step 20. A reflow process may be performed on the second and first semiconductor packages 10 and 20, which are stacked.

Although embodiments are described above with respect to semiconductor packages having different sizes, it should be understood that the semiconductor packages 10 and 20 may have the same or similar sizes. For example, in some embodiments, as illustrated in FIG. 2E, after the first semiconductor package 10 is received on the first step 110 of the stack boat 100, the second semiconductor package 20a having a size equal or similar to that of the first semiconductor package 10 may be provided into the guide and stack holes 250 and 150 when the guide boat 200 is connected to the stack boat 100. A PoP device 30a fabricated according to the present embodiment may include the first and second semiconductor packages 10 and 20a of which the sizes are equal or similar to each other.

Figure 3A:
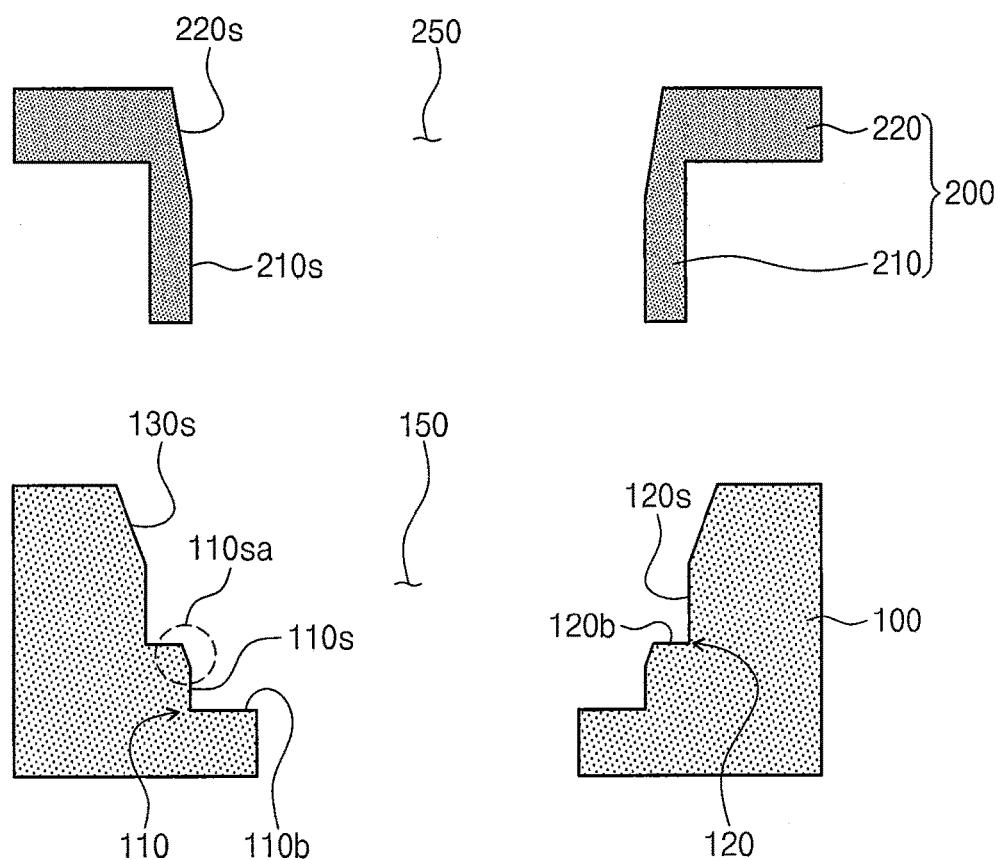
FIG. 3A is a cross-sectional view illustrating a boat assembly for receiving semiconductor packages according to other embodiments of the inventive concepts.
Figure 3B:
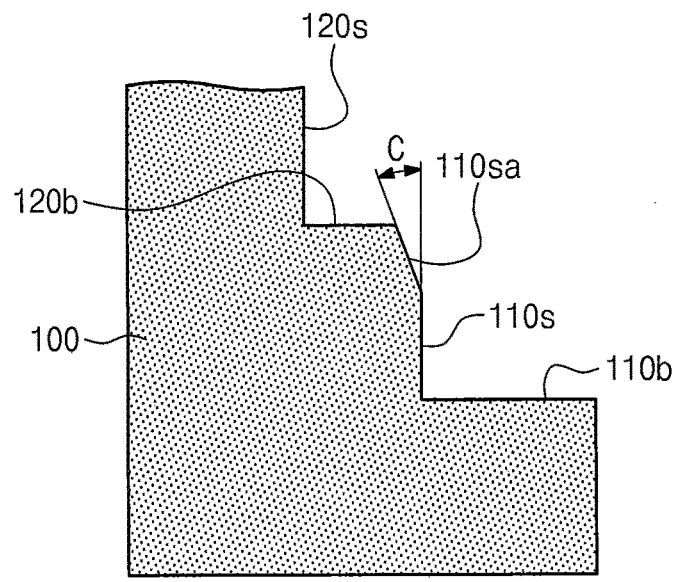
FIG. 3B is an enlarged cross-sectional view illustrating a portion of FIG. 3A.
Figure 3C:
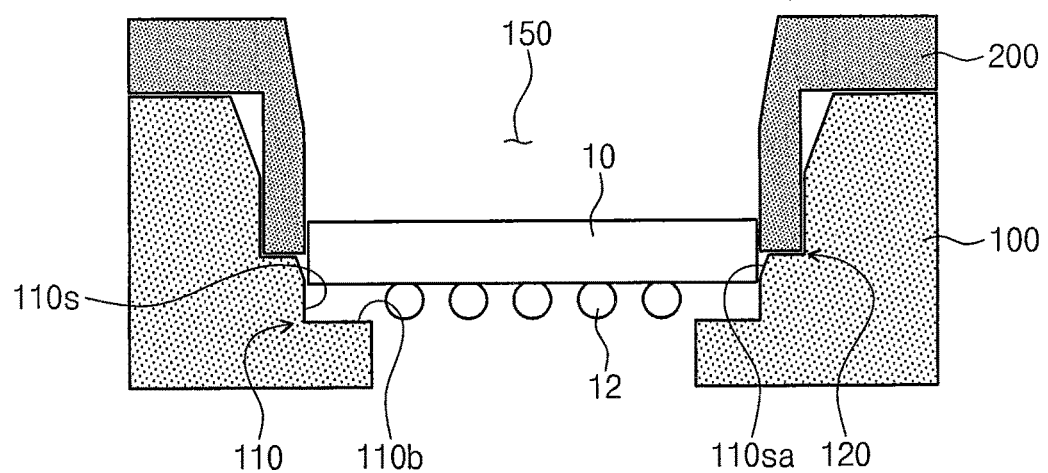
FIG. 3C is a cross-sectional view illustrating operations for receiving semiconductor packages with the boat assembly of FIG. 3A.

FIG. 3A is a cross-sectional view illustrating a boat for receiving semiconductor packages according to other embodiments of the inventive concepts. FIG. 3B is an enlarged cross-sectional view illustrating a portion of FIG. 3A. FIG. 3C is a cross-sectional view illustrating operations for receiving semiconductor packages by the boat of FIG. 3A.

Referring to FIG. 3A, a boat assembly 2 may include a stack boat 100 of which a portion of a first inner sidewalls 110s is inclined. For example, as illustrated in FIG. 3B, a top end portion 110sa of the first inner sidewall 110s may be inclined upward toward the second support surface 120b. The top end portion 110sa of the first inner sidewall 110s may have an angle C that is greater than 0 degree and equal to or less than about 30 degrees. Other elements of the boat 2 may be the same as or similar to corresponding elements of the boat 1 described with reference to FIGS. 1A, 1B, and 1C.

Referring to FIG. 3C, when the first semiconductor package 10 descends toward the first step 110 through the guide boat 200, the first semiconductor package 10 may not come in contact with a top edge of the first step 110 (i.e., the inclined top end portion 110sa of the first inner sidewall 110s). Thus, it is possible to reduce or prevent damage of the first semiconductor package 10 which may be caused by contact or friction between the first semiconductor package 10 and the top end portion 110 as of the first inner sidewall 110s.

Figure 4A:
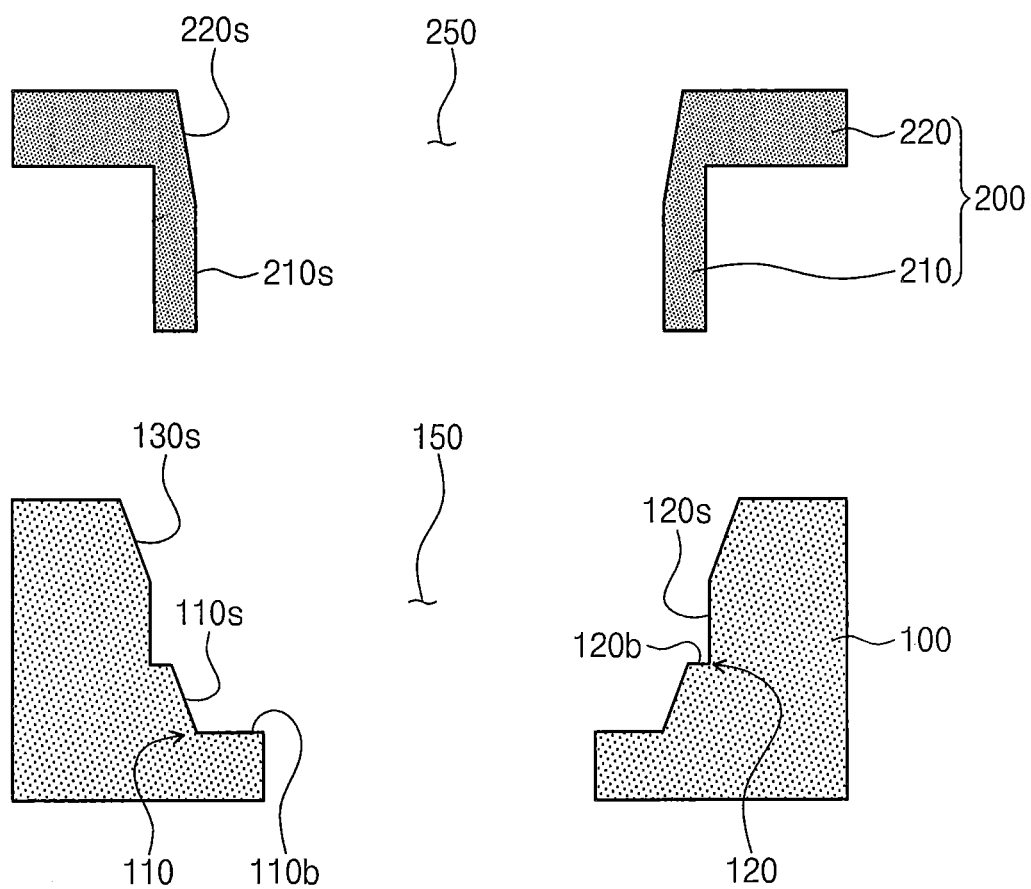
FIG. 4A is a cross-sectional view illustrating a boat assembly for receiving semiconductor packages according to still other embodiments of the inventive concepts.
Figure 4B:
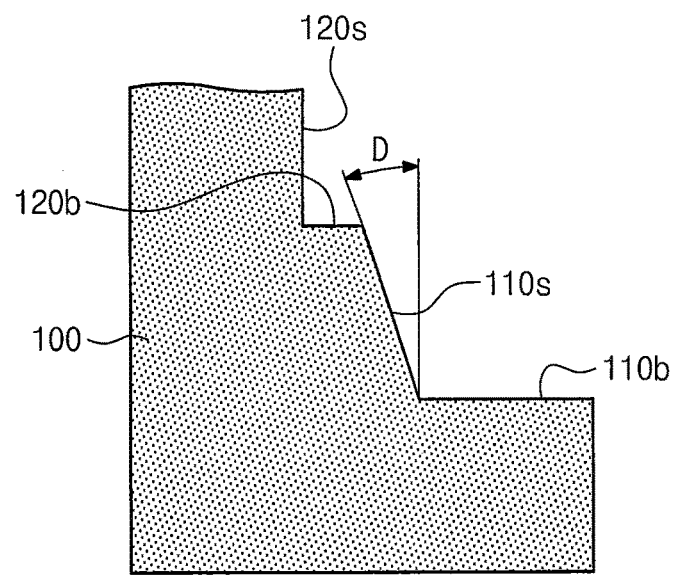
FIG. 4B is an enlarged cross-sectional view illustrating a portion of FIG. 4A.
Figure 4C:
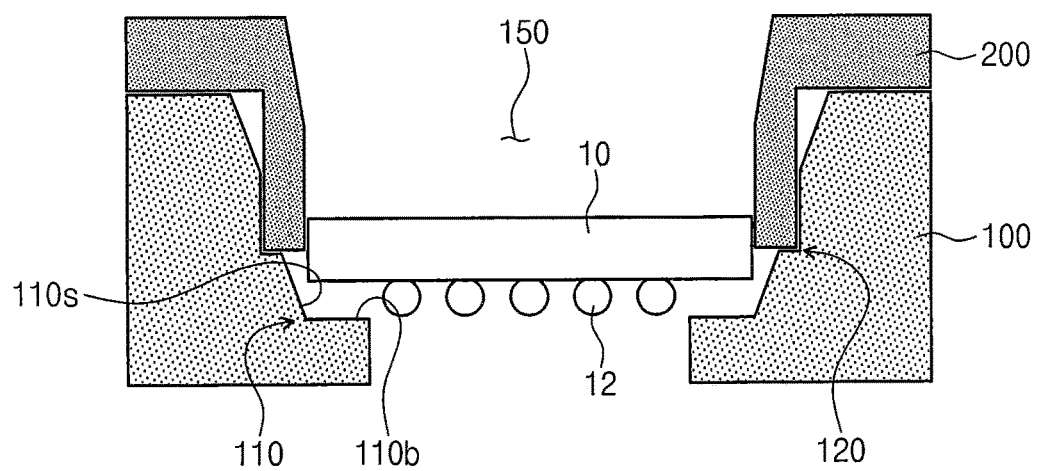
FIG. 4C is a cross-sectional view illustrating operations for receiving semiconductor packages with the boat assembly of FIG. 4A.

FIG. 4A is a cross-sectional view illustrating a boat assembly for receiving semiconductor packages according to still other embodiments of the inventive concepts. FIG. 4B is an enlarged cross-sectional view illustrating a portion of FIG. 4A. FIG. 4C is a cross-sectional view illustrating operations for receiving semiconductor packages by the boat assembly of FIG. 4A.

Referring to FIG. 4A, a boat assembly 3 may include a stack boat 100 having a first inner sidewall 110s that is inclined. For example, as illustrated in FIG. 4B, the first inner sidewall 110s may be inclined upward toward the second support surface 120b. The first inner sidewall 110s may have an angle D that is greater than 0 degree and equal to or less than about 30 degrees. Other elements of the boat 3 may be the same as or similar to corresponding elements of the boat 1 described with reference to FIGS. 1A, 1B, and 1C.

Referring to FIG. 4C, when the first semiconductor package 10 descends toward the first step 110 through the guide boat 200, the first semiconductor package 10 may not come in contact with the first inner sidewall 110s. Thus, it is possible to reduce or prevent damage of the first semiconductor package 10 which may be caused by contact or friction between the first semiconductor package 10 and the first inner sidewall 110s.

Figure 5A:
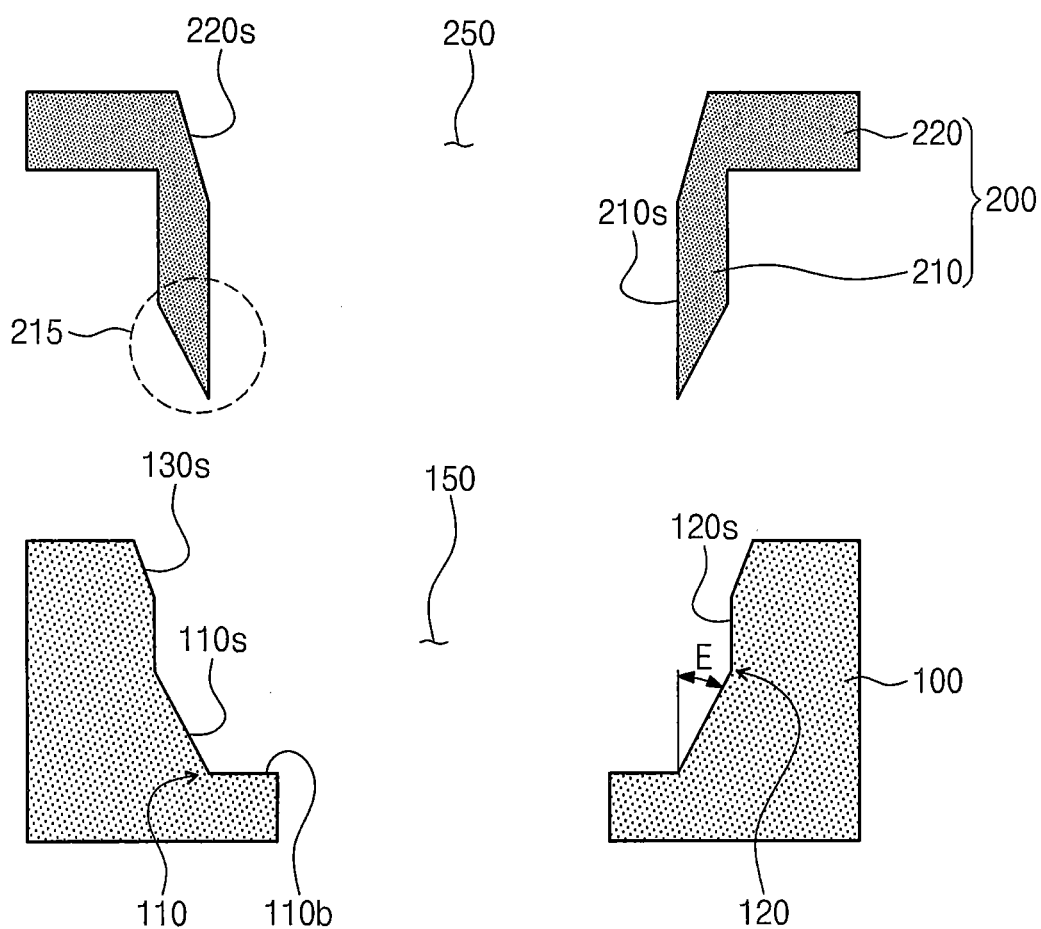
FIG. 5A is a cross-sectional view illustrating a boat assembly for receiving semiconductor packages according to yet other embodiments of the inventive concepts.
Figure 5B:
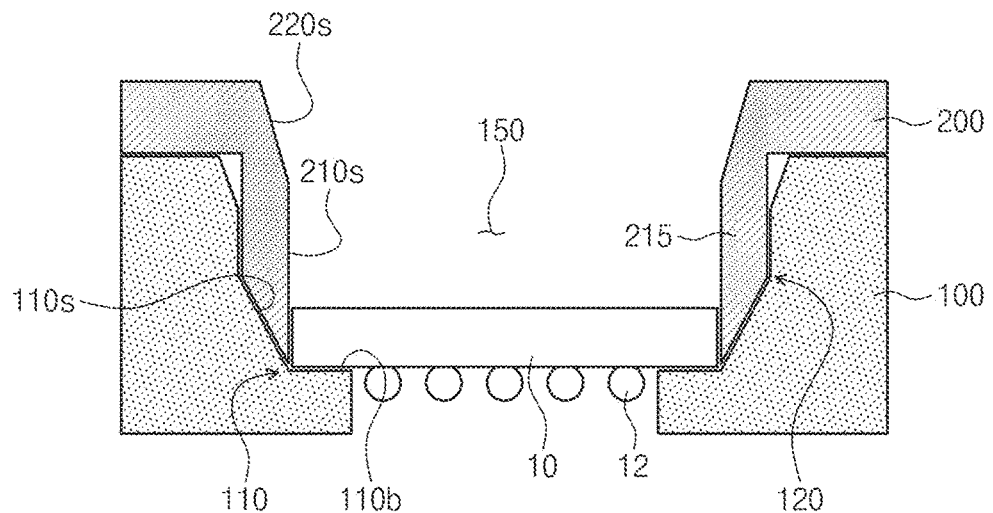
FIGS. 5B and 5C are cross-sectional views illustrating operations for receiving semiconductor packages with the boat assembly of FIG. 5A.
Figure 5C:
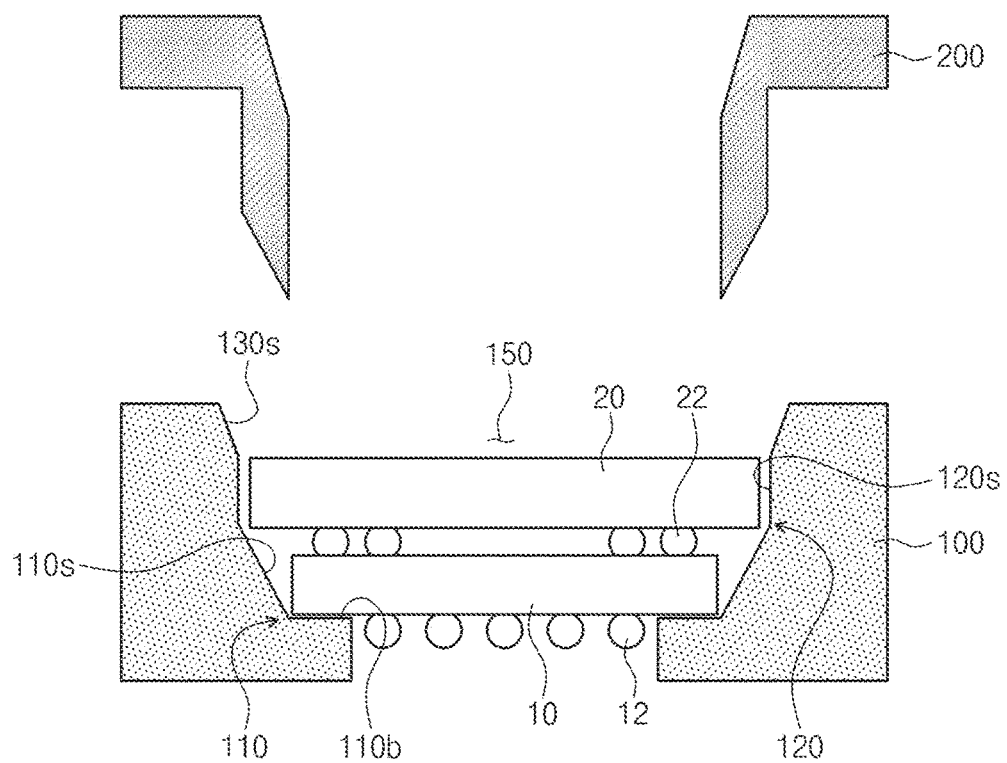

FIG. 5A is a cross-sectional view illustrating a boat assembly for receiving semiconductor packages according to yet other embodiments of the inventive concepts. FIGS. 5B and 5C are cross-sectional views illustrating an operation for receiving semiconductor packages by the boat of FIG. 5A.

Referring to FIG. 5A, a boat 4 may include a stack boat 100 having a first inner sidewall 110s and a second inner sidewall 120s and a guide boat 200 having a wedge-shaped vertical portion 210. The first inner sidewall 110s may be inclined, and the second inner sidewall 120s may be vertical. In other words, the stack boat 100 may not include the second support surface 120b illustrated in FIG. 1C. The first inner sidewall 110s may be inclined upward toward the second inner sidewall 120s. The first inner sidewall 110s may have an angle E that is greater than 0 degree and equal to or less than about 30 degrees. The vertical portion 210 of the guide boat 200 may have a wedge-shaped bottom end portion 215 that corresponds to a structure of the first step 110 of the stack boat 100. Other elements of the boat 4 may be the same as or similar to corresponding elements of the boat 1 described with reference to FIGS. 1A to 1C.

Referring to FIG. 5B, when the guide boat 200 is combined with the stack boat 100, the wedge-shaped bottom end portion 215 may be located on the first inner sidewall 110s. The first semiconductor package 10 may vertically descend along the lower inner sidewall 210s of the guide boat 200 so as to be received safely on the first step 110.

Referring to FIG. 5C, when the first semiconductor package 10 is recessed on the first step 110 of the stack boat 100, the guide boat 200 may be moved upward, for example, to be removed from the stack boat 100. Thus, the first inner sidewall 110s and the second inner sidewall 120s may be exposed. The second semiconductor package 20 may be provided into the stack hole 150 and descend along the second inner sidewall 120s so as to be stacked on the first semiconductor package 10.

Figure 6:
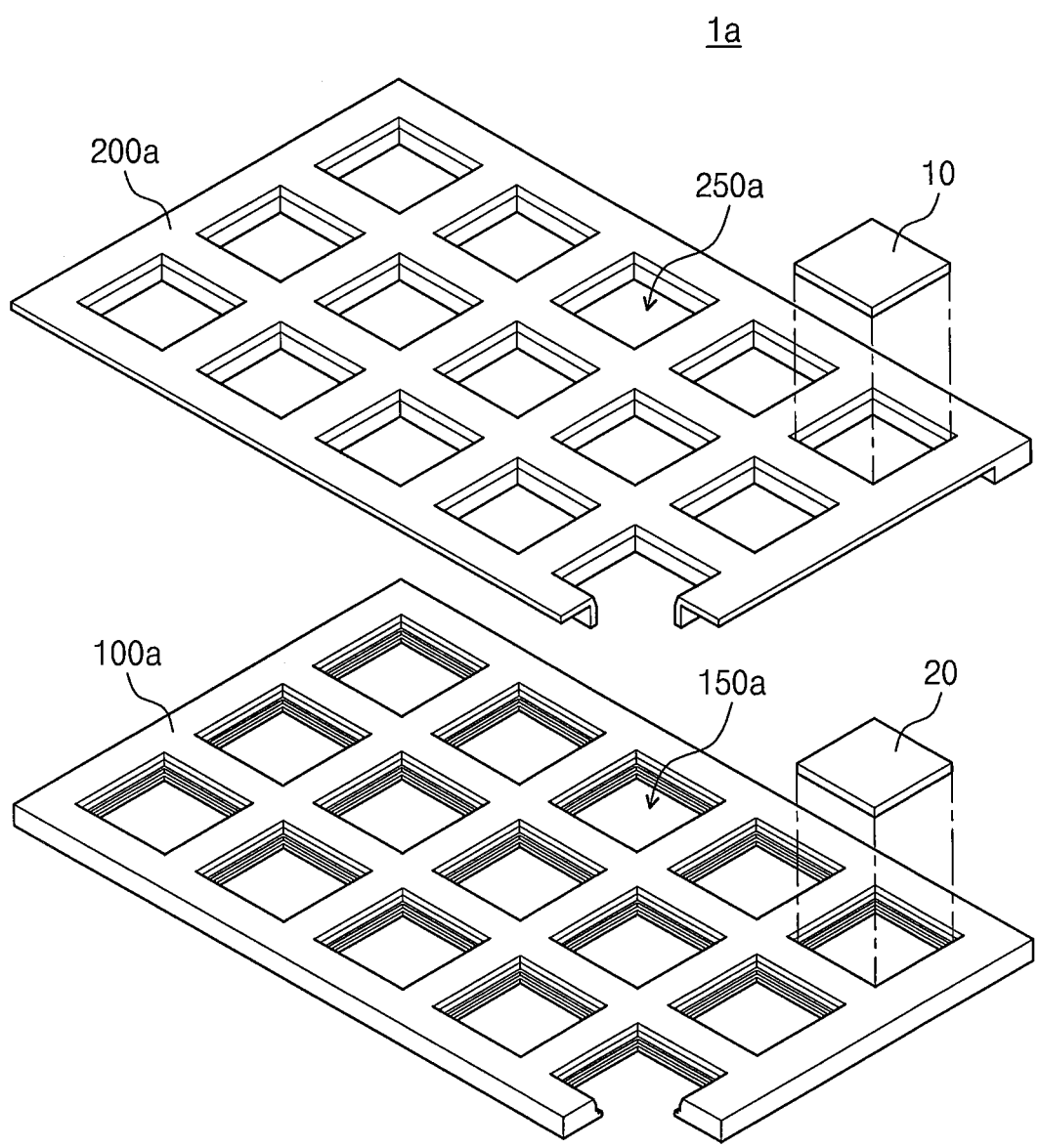
FIG. 6 is a perspective view illustrating a modified embodiment of the boat of FIG. 1A.

FIG. 6 is a perspective view illustrating a modified embodiment of the boat of FIG. 1A. In FIG. 6, cutting views of corner portions of a stack boat and a guide boat are illustrated to help understanding of the present embodiment.

Referring to FIG. 6, a boat assembly 1a may include a stack boat 100a having a plurality of stack holes 150a arranged in an array form and a guide boat 200a having a plurality of guide holes 250a arranged in an array form. Each of the stack holes 150a may receive first and second semiconductor packages 10 and 20 such that the first semiconductor package 10 having a small size may be stacked on the second semiconductor package 20 having a large size in each of the stack holes 150a. Each of the guide holes 250a may guide the first semiconductor package 10. Planar shapes of the stack hole 150a and the guide hole 250a of the boat 1a may be different from those of the stack hole 150 and the guide hole 250 of FIG. 1A. For example, the planar shapes of the stack hole 150a and the guide hole 250a may be quadrilateral shapes. Other elements and other features of the boat 1a may be the same as or similar to corresponding elements and features of the boats 1, 2, 3, and 4.

According to embodiments of the inventive concepts, the stack boat assembly may receive the semiconductor packages having different sizes from each other. Thus, it is possible to easily fabricate the PoP device including the semiconductor packages which have the different sizes from each other and are stacked. The attachable and detachable guide boat may stably provide the semiconductor package to the stack boat by a self-alignment method, so a fabricating yield of PoP devices may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A multi-stepped boat assembly for receiving a semiconductor package, the multi-stepped boat assembly comprising:
   a stack boat having at least one stack hole configured to receive a first semiconductor package and a second semiconductor package that is configured to be vertically stacked on the first semiconductor package in the at least one stack hole; and
   a guide boat having at least one guide hole vertically aligned with the at least one stack hole, the guide boat being removably attachable to the stack boat,
   wherein an inner sidewall of the at least one stack hole comprises:
      a first step configured to receive the first semiconductor package; and
      a second step provided on the first step and configured to receive the second semiconductor package,
   wherein the first step comprises: a first support surface configured to support the first semiconductor package; and a first inner sidewall extending from the first support surface toward the second step,
   wherein the guide boat further comprises:
      a vertical portion forming an outer wall of the at least one guide hole and configured to be inserted into the at least one stack hole such that the vertical portion is supported by the second step; and
      a horizontal portion connected to the vertical portion and configured to be supported by a top end of the stack boat, and
         wherein the vertical portion of the outer wall of the at least one guide hole extends toward the at least one stack hole to guide movement of the first semiconductor package to the first step.

2. The multi-stepped boat assembly of claim 1,
   wherein the second step comprises: a second support surface configured to support the second semiconductor package; and a second inner sidewall extending from the second support surface, and
   wherein the first support surface and the second support surface are horizontal.

3. The multi-stepped boat assembly of claim 2, wherein the first inner sidewall and the second inner sidewall extend vertically.

4. The multi-stepped boat assembly of claim 3, wherein the first inner sidewall further comprises a top end portion inclined upward such that a width of the at least one stack hole increases as a distance from the first support surface increases.

5. The multi-stepped boat assembly of claim 2, wherein the first inner sidewall is inclined upward such that a width of the at least one stack hole increases as a distance from the first support surface increases, and
   wherein the second inner sidewall is vertical.

6. The multi-stepped boat assembly of claim 2, wherein the inner sidewall of the at least one stack hole further comprises: an upper inner sidewall extending from the second step, and
   wherein the upper inner sidewall is inclined upward such that a width of the at least one stack hole increases as a distance from the second step increases.

7. The multi-stepped boat assembly of claim 1,
   wherein the first support surface is horizontal and the first inner sidewall is inclined, and
   wherein the second step comprises: a second inner sidewall extending from the first inner sidewall positioned between the first support surface and the second inner sidewall, the second inner sidewall is perpendicular to the first support surface.

8. The multi-stepped boat assembly of claim 7, wherein the first inner sidewall comprises vertical portions, and the vertical portions have a bottom end portion that corresponds to the first inner sidewall.

9. The multi-stepped boat assembly of claim 1, wherein the at least one guide hole includes a vertical lower inner sidewall and an inclined upper inner sidewall, and
   wherein the inclined upper inner sidewall of the at least one guide hole is inclined upward such that a width of the at least one guide hole increases as a distance from the vertical lower inner sidewall increases.

10. A multi-stepped boat assembly for receiving a semiconductor package, the multi-stepped boat assembly comprising:
   a stack boat having a plurality of stack holes, each of the stack holes configured to receive a first semiconductor package and a second semiconductor package vertically stacked on the first semiconductor package in each of the plurality of the stack holes; and
   a guide boat having a plurality of guide holes vertically aligned with the plurality of stack holes, the guide boat being removably attachable to the stack boat,
   wherein each of the plurality of stack holes has an inner sidewall having a multi-step configuration, and
   wherein each of the plurality of guide holes has a vertical lower inner sidewall and an inclined upper inner sidewall;
   wherein the inner sidewall of each of the plurality of stack holes comprises a first portion defining a first hole width that is configured to receive the first semiconductor package and a second portion defining a second hole width that is different from the first hole width and is configured to receive the second semiconductor package on the first semiconductor package; and
   wherein each of the plurality of guide holes of the guide boat comprise vertical portions that are configured to extend into the second portion of respective ones of the plurality of stack holes of the stack boat when the guide boat is attached to the stack boat to thereby guide the first semiconductor package to the first portion of a respective one of the plurality of stack holes.

11. The multi-stepped boat assembly of claim 10, wherein the multi-step configuration comprises:
a first step comprising: a first support surface supporting the first semiconductor package; and a first inner sidewall vertically extending from the first support surface; and
a second step provided on the first step, the second step comprising: a second support surface supporting the second semiconductor package; and
a second inner sidewall vertically extending from the second support surface,
wherein the first support surface and the second support surface are horizontal.

12. The multi-stepped boat assembly of claim 11, wherein the first inner sidewall further comprises: an inclined top end portion extending in a direction away from the first support surface so as to be connected to the second support surface.

13. The multi-stepped boat assembly of claim 10, wherein the multi-step configuration comprises:
a first step comprising: a first support surface supporting the first semiconductor package; and a first inner sidewall extending from the first support surface; and
a second step provided on the first step, the second step comprising: a second support surface supporting the second semiconductor package; and a second inner sidewall vertically extending from the second support surface,
wherein the first support surface and the second support surface are horizontal, and
wherein the first inner sidewall is inclined.

14. The multi-stepped boat assembly of claim 10, wherein the multi-step configuration comprises:
a first step comprising: a first support surface supporting the first semiconductor package; and a first inner sidewall extending from the first support surface; and
a second step provided on the first step, the second step comprising: a second inner sidewall extending from the first inner sidewall positioned between the first support surface and the second inner sidewall,
wherein the first support surface is horizontal,
wherein the first inner sidewall is inclined, and
wherein the second inner sidewall is perpendicular to the first support surface.

15. The multi-stepped boat assembly of claim 10, wherein the inner sidewall of each of the plurality of stack holes further comprises an inclined surface extending in a direction away from a stepped surface of the multi-step configuration such that a width of each of the plurality of stack holes increases as a distance from the stepped surface of the multi-step increases.

16. The multi-stepped boat assembly of claim 10, wherein each of the plurality of guide holes in the guide boat comprises:
a vertical portion forming an outer wall of each respective one of the plurality of guide holes and configured to be inserted into one of the plurality of stack holes; and
a horizontal portion connected to the vertical portion and configured to be supported by a top end of the stack boat, and
wherein the vertical portion is supported by a stepped surface of the multi-step configuration.

17. A multi-stepped boat assembly for receiving a semiconductor package, the multi-stepped boat assembly comprising:
a stack boat having a plurality of stack holes configured to receive a first and a second semiconductor package that is vertically stacked on the first semiconductor package in the stack hole; and
a guide boat having a plurality of guide holes configured to be vertically aligned with the plurality of stack holes of the stack boat when the guide boat is connected to the stack boat,
wherein an inner sidewall of the each of the plurality of stack hole comprises a first portion defining a first hole width that is configured to receive the first semiconductor package and a second portion defining a second hole width that is different from the first hole width and is configured to receive the second semiconductor package on the first semiconductor package; and
wherein each of the plurality of guide holes of the guide boat comprise vertical portions that are configured to extend into the second portion of respective ones of the plurality of stack holes of the stack boat when the guide boat is attached to the stack boat to thereby guide the first semiconductor package to the first portion of one of the plurality of stack holes.

18. The multi-stepped boat assembly of claim 17, wherein the vertical portions of each of the plurality of guide holes are configured to guide the first semiconductor package to the first portion of a respective one of the plurality of stack holes.

19. The multi-stepped boat assembly of claim 18, wherein when the guide boat is removed from the stack boat, each of the plurality of stack holes is configured to guide the second semiconductor package to the second portion of a respective one of the plurality of stack holes such that the second semiconductor package rests on the first semiconductor package.

20. The multi-stepped boat assembly of claim 17, wherein the vertical portions have a bottom end portion the corresponds to the first inner sidewall.

* * * * *